United States Patent [19]

Mirabel

[11] Patent Number: 5,677,870
[45] Date of Patent: Oct. 14, 1997

[54] NON-VOLATILE PROGRAMMABLE BISTABLE MULTIVIBRATOR, PROGRAMMABLE BY THE SOURCE, FOR THE MEMORY REDUNDANCY CIRCUIT

[75] Inventor: Jean-Michel Mirabel, Gardanne, France

[73] Assignee: SGS-Thomson Microelectronics S.A., Saint Genis, France

[21] Appl. No.: 752,814

[22] Filed: Nov. 21, 1996

Related U.S. Application Data

[62] Division of Ser. No. 380,738, Jan. 30, 1995, Pat. No. 5,592,417.

[30] Foreign Application Priority Data

Jan. 31, 1994 [FR] France .................................. 94 01035

[51] Int. Cl.$^6$ .................................................. G11C 16/06
[52] U.S. Cl. .............................. 365/185.07; 365/185.09; 365/185.28
[58] Field of Search ...................... 365/189.09, 185.07, 365/185.09, 185.26, 185.28

[56] References Cited

U.S. PATENT DOCUMENTS

| | | | |
|---|---|---|---|
| 4,803,662 | 2/1989 | Tanaka | 365/185.07 |
| 5,136,544 | 8/1992 | Rozman | 365/185 |
| 5,267,213 | 11/1993 | Sung | 365/185 |
| 5,440,508 | 8/1995 | Pathak | 365/185 |

FOREIGN PATENT DOCUMENTS

| | | | |
|---|---|---|---|
| 0 525 680 | 2/1993 | European Pat. Off. | G11C 16/04 |
| 9 318 518 | 9/1993 | WIPO | G11C 11/34 |

OTHER PUBLICATIONS

IEEE Journal of Solid-State Circuits, vol. 22, No. 5, Oct. 1987 New York, US, pp. 684–692, Ciaoca, et al., "A Million-Cycle CMOS 256K EEPROM".

IEEE Journal of Solid-State Circuits, vol. 17, No. 5, Oct. 1982, New York, US, pp. 847–851, Donaldson et al., "SNOS 1K×8 Static Nonvolatile RAM".

*Primary Examiner*—David C. Nelms
*Assistant Examiner*—Son Mai
*Attorney, Agent, or Firm*—Wolf, Greenfield & Sacks, P.C.; James H. Morris

[57] ABSTRACT

An electrically programmable, non-volatile memory that can be used for the storage of the defective addresses in a redundancy circuit of a main memory, using bistable type non-volatile cells. Each cell includes floating-gate transistors, one of which is programmed to make the cell bistable. The floating-gate transistor is programmed by the application of a high voltage, to the gate, an intermediate voltage to the source and a zero voltage or a high impedance state to the drain.

29 Claims, 3 Drawing Sheets

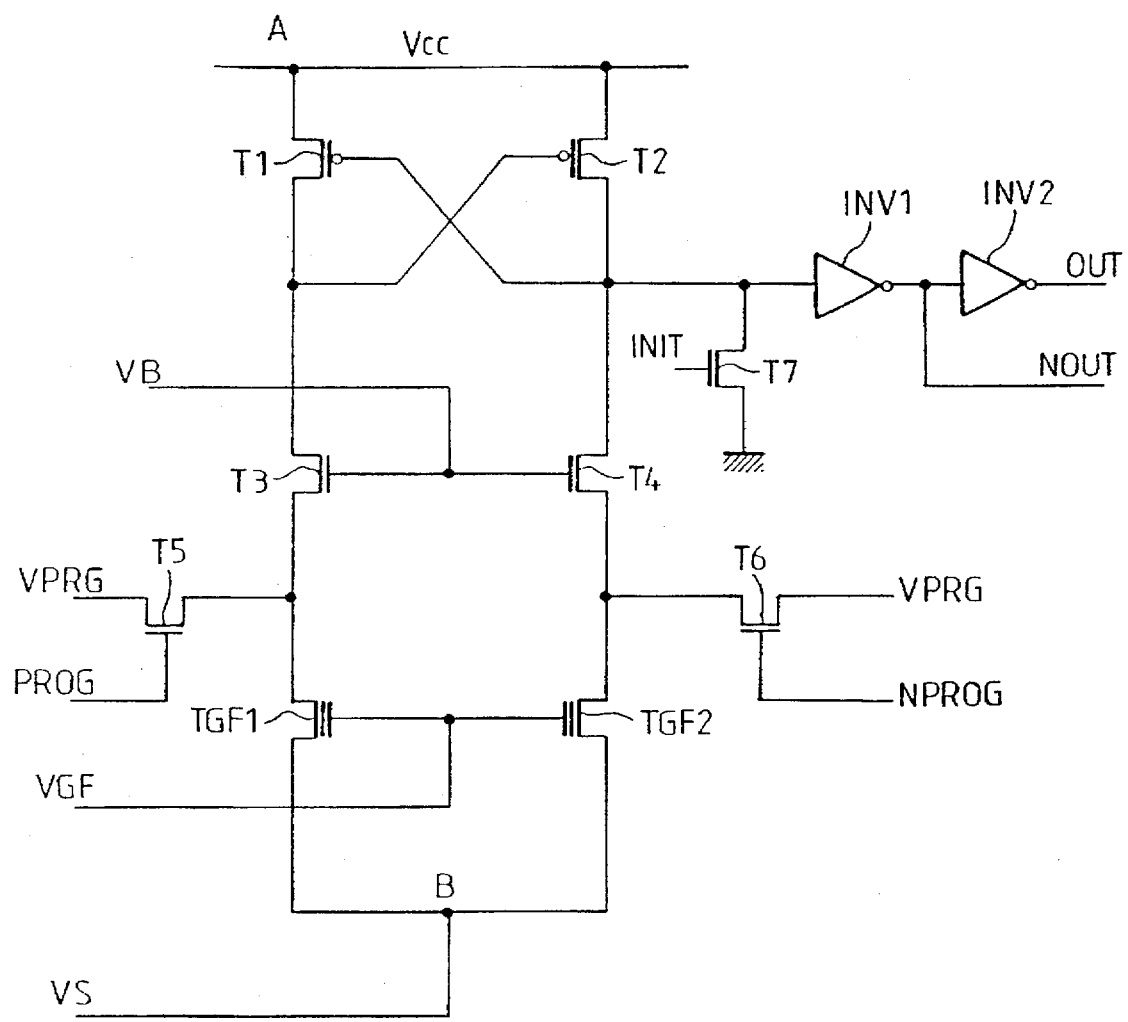
FIG_1
PRIOR ART

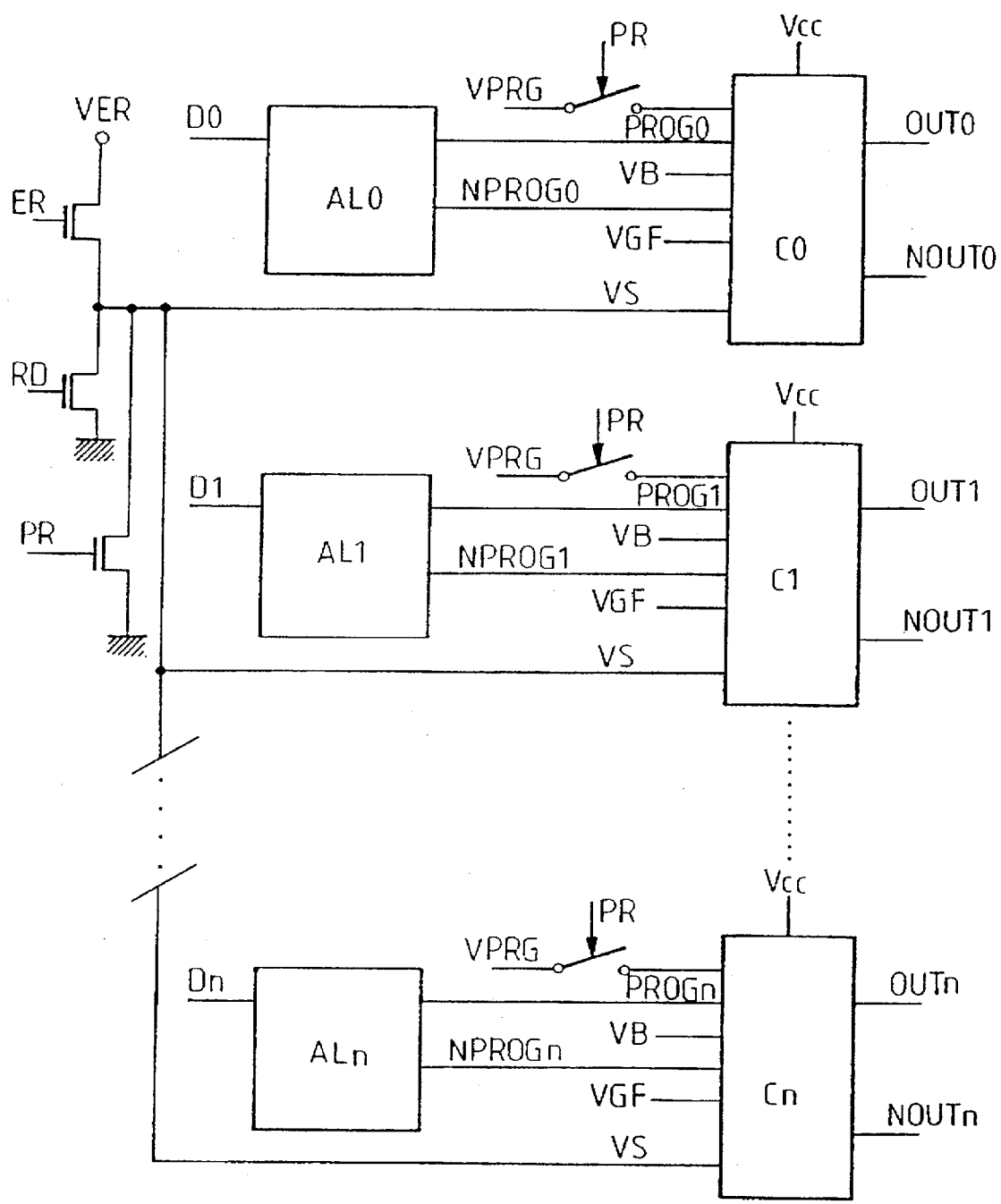
FIG_2
PRIOR ART

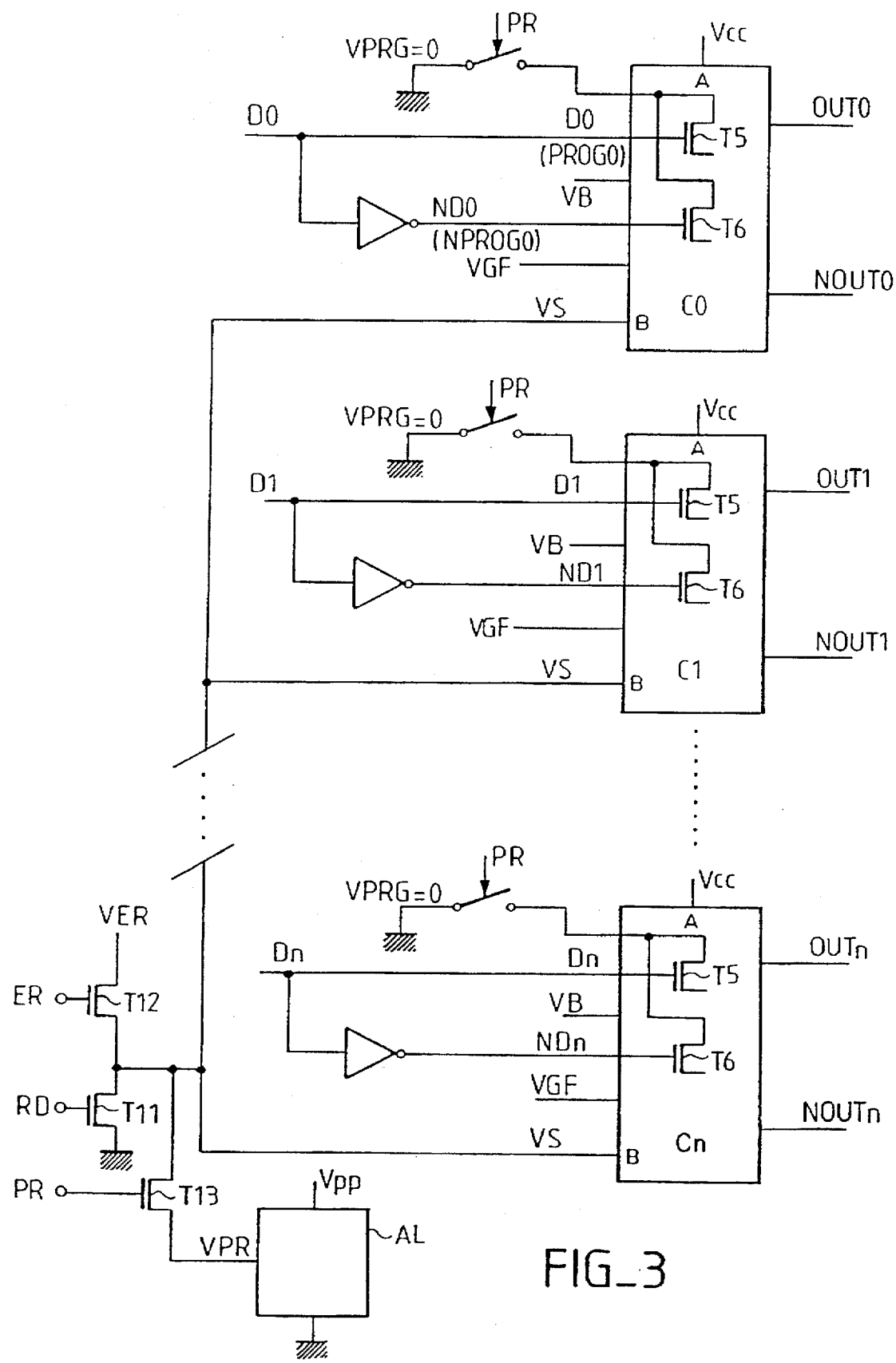
FIG_3

NON-VOLATILE PROGRAMMABLE BISTABLE MULTIVIBRATOR, PROGRAMMABLE BY THE SOURCE, FOR THE MEMORY REDUNDANCY CIRCUIT

This application is a division application Ser. No. 08/380,738, filed Jan. 30, 1995, entitled NON-VOLATILE PROGRAMMABLE BISTABLE MULTIVIBRATOR, PROGRAMMABLE BY THE SOURCE, FOR MEMORY REDUNDANCY CIRCUIT and now allowed as U.S. Pat. No. 5,592,417

BACKGROUND OF THE INVENTION

1. Field of the Invention

The invention relates to integrated circuits, and more particularly to a non-volatile electrically programmable bistable multivibrator which can be used, for example, in a redundancy circuit of a memory in integrated circuit form.

2. Discussion of the Related Art

To provide for a clear understanding of the invention in the context in which it has been conceived of, a brief reminder shall first of all be given of the principles of redundancy circuits currently used in large-capacity memories.

The redundancy circuits of a memory are implemented when defects appear in the rows (word lines used to address the memory) or in the columns (bit lines conveying the data elements to be read or written in the memory).

For example, if a column is defective, it is replaced by a redundancy column as follows: the address of the defective column is stored in a defective address memory; this defective address memory is a memory of the type that is addressable by its contents (hereinafter called CAM or contents addressable memory); whenever an address is applied to the main memory, this address is also applied to the CAM. If the address applied is identical to the address stored, a redundancy circuit is put into operation and acts to disconnect the defective column and connect a redundant column in its place in a way that is invisible to the user.

In practice, according to the organization of the main memory, if a column is defective, it is rather a group of columns containing this defective column that will be replaced by a group of redundancy columns. In general, if a group of columns is defined by an address bit of the large-capacity memory, it is this group of columns that will be replaced as a whole. Hereinafter, for simplicity's sake, reference shall be made, in the description, to the replacing of only one column rather than to the replacing of a group of columns.

For a main memory of several megabits, the possibility of repairing several defects is foreseen. There are therefore as many redundancy columns as there are defective columns or rows which it should be possible to repair. With each redundancy column, there is associated a respective CAM containing the address of a defective column. If N defects are to be repaired, N redundancy columns and N CAMs are needed. Typically, N=36 for a four-megabit or sixteen-megabit memory.

If a column of the main memory is designated by an M-bit address (for example M=5), then each CAM contains at least M+1 bits: M bits to define the address of a defective column and one validation bit to indicate that the redundancy circuit corresponding to this CAM should actually be activated when the defective address is applied to the CAM.

To make CAMs, the first devices used were groups of physical fuses that were fused electrically or fused by laser beam, each fuse representing an address bit or a validation bit. These fuses had drawbacks (relating to reliability, bulkiness, consumption, and difficulty of programming) and were soon replaced by non-erasable non-volatile memory cells. The latter too had drawbacks (they consumed substantial current) and there was a gradual trend towards the use of programmable bistable multivibrators comprising two floating-gate transistors for each address bit or validation bit.

FIG. 1 shows a prior art non-volatile programmable bistable multivibrator constituting a storage cell of a defective address bit (or a validation bit), and therefore constituting one of the M+1 cells of a defective address CAM.

The output OUT of this cell is at a logic level 0 or 1 depending on the state in which the bistable multivibrator is programmed. This output therefore defines a value of an address bit (or the value of the validation bit).

If the cell corresponds to one of the M defective address bits, the output of each cell of these M address bits is applied to an input of an exclusive-OR gate (not shown). The exclusive-OR gate receives, at another input, a corresponding address bit received by the main memory. The outputs of the exclusive-OR gates corresponding to the different address bits of one and the same defective address memory are applied to an input of a NOR gate (not shown). The output of this NOR gate gives a logic 1 level only when there is coincidence between all the address bits applied and all the corresponding bits of the defective address memory. The output of the NOR gate is validated by the output of the memory cell corresponding to the validation bit, for example by means of an AND gate (not shown). The output of the AND gate is the output of the CAM and is used to put a redundancy path into operation whenever the address applied to the main memory corresponds to the defective address recorded.

In general, there are N memories with defective addresses (for example N=36). During the testing of the main memory, the detection of a defective column activates the storage of the address of this column in one of the CAMs. The different CAMs are thus successively programmed as and when the defects are detected. During the normal operation of the main memory, the addresses of this memory are applied simultaneously to all the CAMs. If there is correspondence between the applied address and the address stored in one of them, the redundancy path corresponding to this address is activated.

To enable the programming of a defective address in a CAM, it is therefore provided that a respective address bit of the main memory will be applied to each cell of the CAM. The programming is done upon a command of the testing apparatus in the event of the detection of a defect at the address being tested.

The individual memory cell shown in FIG. 1 has two arms with a floating-gate transistor, TGF1 or TGF2 in each arm. The arms are arranged so as to form a bistable multivibrator as soon as one of these two transistors is programmed. The state of the bistable multivibrator, represented by the output OUT and corresponding to an address bit or a validation bit, is then a function of that one of the two transistors which is programmed. At the outset, the two transistors are in a non-programmed or blank state. During the testing of the memory, one of the two transistors is programmed to obtain either a 0 or a 1 at the output OUT of the cell, thus defining a definitive stable state 0 or 1 of the cell.

More specifically, the cell of FIG. 1 has two identical arms in parallel between a supply terminal A (potential Vcc of the order of 3 volts) and a terminal B. The terminal B is at a zero potential VS in reading or programming mode and may also be taken to a high potential VS (12 volts) in erasure mode if an erasure mode is planned (e.g., in flash EPROMs). In series in each arm, there is a P channel transistor (T1 or T2), an N channel transistor (T3 or T4), and a floating-gate transistor (TGF1 or TGF2). The gate of the P channel transistor (T1 or T2) of one of the arms is connected to the drain of the P channel transistor (T2 or T1) of the other arm. The gates of the N channel transistors (T3 or T4) are connected together to a common potential VB whose value depends on the mode of operation (about 1.8 volts in reading mode to have one volt on the drain of the cells; 0 volts in programming or erasure mode). The transistors T3 and T4 are insulation transistors to prevent the transmission, to the transistors T1 and T2, of the relatively high voltages applied to the floating-gate transistors in programming or erasure mode. The gates of the floating-gate transistors TGF1, TGF2 are connected to a common potential VGF depending on the operation (about 3 volts in read mode, about 12 volts in programming mode). The source of these transistors is connected to the node B (potential VS). The drain potentials of the floating-gate transistors are controlled by transistors T5 and T6 respectively, enabling either the connection of the drain to a programming potential VPRG (transistor T5 or T6 conductive) or the leaving of the drain in high impedance (transistor T5 or T6 off). In programming mode, the gate of the transistor T5 is controlled by a programming signal PROG and the gate of T6 by a complementary signal NPROG. As a result, a choice is made, depending on the state of the signal PROG, of that transistor of the two floating transistors which must be programmed and that transistor which must remain blank. In reading mode, the drain of the transistors T5 and T6 remains in a state of high impedance, the voltage VPRG being not applied to these drains.

The cell is called a bistable cell because it has one stable state among two possible states, the stable state that it takes depending on that one of the two transistors that has been programmed. The state of the cell is read at the drain of one of the P channel transistors (T2 for example). This drain is connected to the input of a first inverter INV1 followed by a second inverter INV2. The output of INV2 is the output OUT of the cell. The output of INV1 is used as a complementary output NOUT if it is needed.

Finally, a supplementary transistor T7 may make it possible, solely in test mode, in order to avoid the floating nodes when T3 and T4 are off, to place the input of the inverter INV1 temporarily at the ground (for an initialization of the state of the cell at each power-on-reset operation). The gate of this transistor is activated by an initializing rectangular-wave signal INIT produced by a standard power-on-reset circuit (not shown).

To program the bistable multivibrator in one state or another, a high programming voltage (VGF=about 12 volts) is applied to the control gates of the floating gate transistors, and a mean voltage (VPRG=5 to 7 volts) is applied to the drain of that one of the transistors TGF1 or TGF2 which is to be programmed. The signal PROG/NPROG defines the state 0 or 1 to be programmed. The programming is done by hot electrons, namely with a flow of current in the transistor that is programmed. The transistors T3 and T4 are off (VB=0) during the programming so that the voltage VPRG is not applied to the transistors T1 and T2 which are low-voltage transistors. The source potential VS is set at zero.

The general structure of a group of bistable cells constituting an addressable memory is shown in FIG. 2 in the case where it is furthermore sought to be able to totally erase the cells by the application of a high potential to the sources of the transistors (the case where the floating-gate transistors are flash EPROM type transistors).

The bistable cells are designated by C0 to Cn. Each one receives the voltage VPRG, the voltage VGF, the voltage Vcc, the voltage VB, the voltage VS (all these voltages are common to all the cells) and the programming data specific to each cell depending on the state in which it is to be programmed: PROG0, NPROG0 for the cell C0, PROG1, NPROG1 for the cell C1, etc.

In reading mode, the cells give the complementary outputs OUT0, NOUT0 for the cell C0, and the similar signals for the other cells: OUT1, NOUT1, etc.

In reading or programming mode, VS is set at zero by a control signal RD (reading) or PR (programming). In erasure mode, VS is set at high voltage VER (about 12 volts) by a control signal ER. In programming mode (PR) the voltage VPRG is effectively applied to the transistors T5 and T6 of the cells.

In programming mode, the programming data signals (PROG0, NPROG0 for example) must be given at a potential level that is sufficient to control the transistors T5 and T6 (FIG. 1) and transmit the voltage VPRG which is high (5 to 7 volts). Now the programming data signals are simply address bits D0 to Dn coming from the address decoder of the main memory. They therefore come from low-voltage logic circuits (generally Vcc=3 volts for this type of circuit). It is therefore necessary to place a voltage pull-up circuit between each data signal (D0 to Dn) at low voltage and the inputs PROG0, NPROG0 . . . PROGn, NPROGn at higher voltage. These voltage pull-up circuits, designated AL0 to ALn in FIG. 2, are bulky (comprising about ten transistors each for example).

SUMMARY OF THE INVENTION

One aim of the invention is to reduce the total amount of space taken up by the memory formed by a group of non-volatile programmable bistable cells.

To improve the memories of this type, one illustrative embodiment of the invention programs the floating-gate transistors by the source, specifically by applying a high programming voltage to the source and not to the drain, and by placing the drain at ground, or in a state of high impedance depending on whether or not the transistor has to be programmed.

In another illustrative embodiment of the invention, a memory formed by bistable cells comprising two floating-gate transistors each, wherein the memory comprises means for the application, in programming mode, of a first fixed programming voltage to the sources of the floating-gate transistors of the different cells, a second fixed programming voltage to the control gates and a zero voltage or a high impedance state to the drains depending on the state of programming desired for the cell. The zero voltage reference is the voltage applied to the sources in reading mode.

In a further illustrative embodiment of the invention, the memory is a flash EPROM type transistor memory, programmable by hot electrons and erasable by the application of a sufficient field between gate and source.

BRIEF DESCRIPTION OF THE DRAWINGS

Other features and advantages of the invention shall appear from the following detailed description, made with reference to the appended drawings, of which:

FIG. 1, already described shows a prior art storage cell;

FIG. 2 shows an organization of memory with several cells of the prior art; and

FIG. 3 shows an organization of memory according to the invention.

DETAILED DESCRIPTION

FIG. 3 shows the general organization of a memory according to the invention which, it shall be assumed, is a defective address memory that forms part of the redundancy circuits of a main memory and is designed to store addresses of defective elements of the main memory.

The memory cells are constituted as in FIG. 1 and may therefore receive the following voltages:

Vcc (about 3 volts) at the node A;

VPRG equal according to the invention to 0 volts at the drain of the transistors T5 and T6 in programming mode only;

VGF at the gates of the floating-gate transistors, equal to about 12 volts in programming mode, or 3 volts in reading mode;

VS at the node B, equal to about 5 to 7 volts in programming mode, 0 volts in reading mode and about 12 volts in erasure mode;

VB, biasing potential of the gates of the transistors T3 and T4, whose value is sufficient (about 1.8 volts) to make these transistors conductive in reading mode and to turn them off (VB=0) in programming mode; and a programming data element, in the form of a logic signal and its complement, D0 and ND0 for the cell 0 for example, D1, ND1 to Dn, NDn for the others; these logic signals, which have a low voltage level, come from the address decoder of the main memory and are directly applied to the gates of the transistors T5 and T6 without the use of voltage pull-up circuits.

FIG. 3 shows the very simple circuit elements used to apply different possible potentials VS to the node B of the cells.

A first transistor T11 is made conductive by a reading mode control signal RD. It is then used to transmit the ground potential (VS=0) to the node B of all the cells together. A second transistor T12 made conductive by an erasure mode control signal ER. It enables the transmission of a high potential of erasure VS=VER (for example 12 volts) to the node B of all the cells together. Finally, a third transistor T13 is made conductive by a programming control signal PR. It enables the transmission of an intermediate programming potential VS=VPR (5 to 7 volts) to the node B of all the cells together. This potential VPR is given by a supply circuit AL, for example from an external supply voltage Vpp of 12 volts.

For the programming, the programming data element D0, ND0 defines which one of the transistors, T5 or T6, of the cell C0 will be made conductive, the other one then being off. The transistor that is made conductive grounds the drain of the corresponding floating-gate transistor. The corresponding floating-gate transistor is programmed by hot electrons while the source is at 5 to 7 volts and the gate is at a programming voltage of about 12 volts. The other floating-gate transistors is not programmed even though it receives the same gate and source voltages, because its drain remains at high impedance.

The reading and the erasure are done according to standard procedures. For the reading, the drains of the transistors T5 and T6 no longer receive the programming voltage VPRG and remain in a state of high impedance. The node B is grounded. For the erasure, the node B is at 12 volts and the gates of the floating-gate transistor are grounded.

Through the invention, it is possible to limit the structure to just one voltage pull-up circuit AL for all the cells instead of one pull-up circuit for each cell. Thus there is a saving of space in the integrated circuit.

The invention can be applied to memory cells different from those shown in FIG. 1. For example, the invention can be applied to a memory cell similar to FIG. 1, but wherein insulation transistors are interposed between the transistors T5 and T6 and the drains of TGF1 and TGF2, these insulation transistors, controlled by one and the same signal, enabling the selection of a single group of cells at a time and being off in reading mode to prevent the parasitic transmission of signals to the cell. Another type of cell to which the invention can be applied has an additional transistor controlled by the output OUT and interposed between the transistor T2 and the transistor T4 (to place the cell in a state of imbalance so that it has a well determined stable state even before programming). This second type of cell is described in U.S. patent application entitled Non-Volatile Programmable Bistable Multivibrator in Predefined Initial State for Memory Redundancy Circuit by Jean-Michel Mirable, and French patent application Ser. Nos. 94 01034 and 94 01036, each of which is incorporated herein by reference.

The structure of the memory cell is therefore not modified, but the programming command is different and the programming circuits are therefore modified accordingly, the modification includes in particular the elimination of the voltage pull-up circuits AL0 to ALn.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An electrically programmable non-volatile memory for storing states of a plurality of data signals when a programming signal is enabled, the electrically programmable non-volatile memory comprising:

a plurality of bistable cells, each bistable cell including first and second floating-gate transistors, each floating gate transistor having a drain, a source and a control gate, each bistable cell for storing a state of one of the plurality of data signals; and programming circuitry, enabled by the programming signal, that applies;

a first programming voltage to the sources of the first and second floating-gate transistors;

a second programming voltage to the control gates of the first and second floating-gate transistors; a zero voltage to the drain of the first floating-gate transistor and a high impedance to the drain of the second floating-gate transistor when the data signal is in a first state; and a zero voltage to the drain of the second floating-gate transistor and a high impedance to the drain of the first floating-gate transistor when the data signal is in a second state.

2. The electrically programmable non-volatile memory of claim 1, wherein the first programming voltage and the second programming voltage are both fixed programming voltages.

3. The electrically programmable non-volatile memory of claim 2, wherein the programming circuitry further includes read circuitry responsive to a read signal that enables the logical values of the bistable cells to be read, and erase circuitry responsive to an erase signal that enables the logical values of the bistable cells to be erased.

4. The electrically programmable non-volatile memory of claim 3, wherein the floating-gate transistor of each bistable cell is a flash EPROM cell having a floating-gate region, each flash EPROM cell being programmable by the injection of hot electrons into the floating-gate region and erasable by the application an electric field between the control gate and the source of the floating-gate transistor.

5. The electrically programmable non-volatile memory of claim 4, wherein each bistable cell further includes first and second bistable cell transistors, each bistable cell transistor having a source, a drain, and a control gate;

the source of each bistable cell transistor being coupled to a voltage supply source;

the control gate of the first bistable cell transistor being coupled to both the drain of the second bistable cell transistor and the drain of the second floating-gate transistor; and the control gate of the second bistable cell transistor being coupled to both the drain of the first bistable cell transistor and the drain of the first floating-gate transistor, thereby creating a bistable multivibrator when the cell is programmed.

6. The electrically programmable non-volatile memory of claim 5, in combination with a memory circuit to form a main memory, wherein each bistable cell receives one of the plurality of data signals through an address line of the main memory so that the electrically programmable non-volatile memory implements a redundancy circuit for the non-volatile storage of an address of a defective element of the memory circuit, the address being represented by the plurality of states of the plurality of data signals.

7. The electrically programmable non-volatile memory of claim 3, wherein each bistable cell further includes first and second bistable cell transistors, each bistable cell transistor having a source, a drain, and a control gate, wherein the source of each bistable cell transistor being coupled to a voltage supply source;

the control gate of the first bistable cell transistor being coupled to both the drain of the second bistable cell transistor and the drain of the second floating-gate transistor; and the control gate of the second bistable cell transistor being coupled to both the drain of the first bistable cell transistor and the drain of the first floating-gate transistor, thereby creating a bistable multivibrator when the cell is programmed.

8. The electrically programmable non-volatile memory of claim 7, wherein each bistable cell further includes a third bistable cell transistor having a drain connected to the drain of the first bistable cell transistor, a source connected to the drain of the first floating-gate transistor, and a gate that receives an insulating signal, the insulating signal being activated when the programming signal is enabled; and a fourth bistable cell transistor having a drain connected to the drain of the second bistable cell transistor, a source connected to the drain of the second floating-gate transistor, and a gate that receives the insulating signal, the third and fourth bistable cell transistors insulating the first and second bistable cell transistors from high voltages applied to the first and second floating-gate transistors upon receipt of the insulating signal by the gates of the third and fourth bistable cell transistors.

9. The electrically programmable non-volatile memory of claim 8, wherein the programming circuitry further includes, for each bistable cell, a first programming transistor having a gate for receiving the respective data signal of the bistable cell, a source for receiving one of the high impedance and the zero voltage, and a drain coupled to the drain of the first floating-gate transistor, the first programming transistor controlling the application of one of the zero voltage and the high impedance to the drain of the first floating-gate transistor, and a second programming transistor having a gate for receiving an inverted form of the respective data signal of the bistable cell, a source for receiving one of the high impedance and a voltage reference, and a drain coupled to the drain of the second floating-gate transistor, the second programming transistor controlling the application of one of the zero voltage and the high impedance to the drain of the second floating-gate transistor.

10. The electrically programmable non-volatile memory of claim 9, wherein the data signal received by the gate of the first programming transistor and the inverted data signal received by the gate of the second programming transistor have low voltage logic levels.

11. The electrically programmable non-volatile memory of claim 10, wherein for each bistable cell:

when the respective data signal is in the first state, the first programming transistor couples the drain of the first floating-gate transistor to the zero voltage, and the second programming transistor couples the drain of the second floating-gate transistor to the high impedance, and when the respective data signal is in the second state, the first programming transistor couples the drain of the first floating-gate transistor to the high impedance and the second programming transistor couples the drain of the second floating-gate transistor to the zero voltage.

12. The memory of claim 11, wherein the first programming voltage is between 5 volts and 7 volts, and the second programming voltage is approximately 12 volts.

13. The memory of claim 7, wherein the first programming voltage is between 5 volts and 7 volts, and the second programming voltage is approximately 12 volts.

14. A circuit for programming a plurality of bistable cells to store information relating to the values of a corresponding plurality of bits, each bistable cell having a first input for receiving an enabling voltage that enables programming of the bistable cell, each bistable cell including first and second circuit elements that each has first and second terminals, each bistable cell further having a second input coupled to the first terminal of each of the first and second elements for receiving a voltage, a third input coupled to the second terminal of the first element and a fourth input coupled to the second terminal of the second element, each bistable cell assuming either of a first and second state, each bistable cell assuming the first state when enabled and when a first predetermined voltage difference is established between the first and second terminals of the first element, and assuming the second state when enabled and when a second predetermined voltage difference is established between the first and second terminals of the second element, the circuit comprising:

means for applying the enabling voltage to the first input of each bistable cell when it is desired to store the information relating to the values of the plurality of bits;

means for providing a first voltage to the second input of each of the bistable cells;

means for applying a second voltage to the third input of the bistable cell, the second voltage being less than the first voltage, a difference between the first and second voltages being equal to at least the first predetermined voltage difference;

means for applying a high impedance to the fourth input of each bistable cell whose corresponding bit has the first value;

means for applying a third voltage to the fourth input of the bistable cell, the third voltage being less than the first voltage, a difference between the first and third voltages being equal to at least the second predetermined voltage difference; and means for applying a high impedance to the third input of each bistable cell whose corresponding bit has the second value.

15. The circuit of claim 14, wherein:

the means for applying a second voltage includes means for connecting the third input to ground; and the means for applying a third voltage includes means for connecting the fourth input to ground.

16. The circuit of claim 15, wherein each of the plurality of bits has a bit voltage, and wherein the first voltage is greater than the bit voltage.

17. The circuit of claim 16, wherein the means for providing a first voltage includes a number of voltage sources that is less than the number of bits in the plurality of bits.

18. The circuit of claim 16, wherein the means for providing a first voltage includes a single voltage source.

19. The circuit of claim 14, wherein each of the plurality of bits has a bit voltage, and wherein the first voltage is greater than the bit voltage.

20. The circuit of claim 14, wherein the means for providing a first voltage includes a number of voltage sources that is less than the number of bits in the plurality of bits.

21. The circuit of claim 14, wherein the means for providing a first voltage includes a single voltage source.

22. An electrically programmable non-volatile memory, comprising:

M bistable cells for storing information relating to the values of M corresponding bits, M being a positive integer greater than 1, each bistable cell having first and second floating-gate transistors, each floating-gate transistor having a gate, a drain, and a source;

programming circuitry that applies a reference voltage to the drain of one of the two floating-gate transistors and a high impedance to the drain of the other of the two floating-gate transistors depending on the state of programming desired for the cell; and a voltage source that provides a positive voltage to each of the sources floating-gate transistors of the M bistable cells, for programming the plurality of bistable cells.

23. The memory of claim 22, wherein the voltage sources provides a source voltage to the sources of the floating-gate transistors of each of the bistable cells, the source voltage being higher than the reference voltage.

24. A programming circuit for programming a plurality of bistable cells, each bistable cell including a first floating-gate transistor and a second floating-gate transistor, each floating-gate transistor having a drain and a source, the programming circuit comprising:

a control terminal to receive a programming signal;

a first voltage control circuit having an input coupled to the control terminal, and an output to be coupled to the sources of the first and second floating-gate transistors of each bistable cell, wherein the sources of the first and second floating-gate transistors of each bistable cell receive, in response to the control terminal receiving the programming signal, a first voltage from the output of the first voltage control circuit; and a second voltage control circuit having an input coupled to the control terminal, and an output to be coupled to the first and second floating-gate transistors of at least one bistable cell, wherein the drain one of the first and second floating-gate transistors of the at least one bistable cell receives, in response to the control terminal receiving the programming signal, a second voltage from the output of the second voltage control circuit, wherein the drain of the other of the first and second floating-gate transistors of the at least one bistable cell receives, in response to the control terminal receiving the programming signal, a high impedance, and wherein the first voltage is greater than the second voltage.

25. The programming circuit of claim 24, wherein the first voltage control circuit includes a switch having:

a control input, as the first voltage control circuit's input coupled to the control terminal;

a first contact, as the first voltage control circuit's output to be coupled to the sources of the first and second floating-gate transistors of each bistable cell; and a second contact to be coupled to a supply circuit that provides the first voltage, wherein the switch electrically connects, in response to the control terminal receiving the programming signal, the sources of the first and second floating-gate transistors of each bistable cell to the supply circuit.

26. The programming circuit of claim 24, wherein the second voltage control circuit includes a switch having:

a control input, as the second voltage control circuit's input coupled to the control terminal;

a first contact, as the second voltage control circuit's output to be coupled to the first and second floating-gate transistors of the at least one bistable cell; and a second contact coupled to a ground reference, wherein the switch electrically connects, in response to the control terminal receiving the programming signal, the drain of the one of the first and second floating-gate transistors of the at least one bistable cell to the ground reference such that zero volts is provided, as the second voltage, to the drain of the one of the first and second floating-gate transistors of the at least one bistable cell.

27. A programming circuit for programming a plurality of bistable cells, each bistable cell including a first floating-gate transistor and a second floating-gate transistor, each floating-gate transistor having a drain and a source, the programming circuit comprising:

means for applying, in response to a programming signal, a first voltage to the sources of the first and second floating-gate transistors of each bistable cell; and means for applying, in response to the programming signal, a second voltage to the drain of one of the first and second floating-gate transistors of each bistable cell, and a high impedance to the drain of the other of the first and second floating-gate transistors of each bistable cell, wherein the first voltage is greater than the second voltage.

28. The programming circuit of claim 27, wherein the means for applying the first voltage includes:

means for electrically connecting, in response to the programming signal, the sources of the first and second floating-gate transistors of each bistable cell, to a supply circuit that supplies the first voltage.

29. The programming circuit of claim 27, wherein the means for applying the second voltage includes:

means for electrically connecting, in response to the programming signal, at least one bistable cell to a ground reference such that zero volts is provided, as the second voltage, to the drain of the one of the first and second floating-gate transistors of the at least one bistable cell.

* * * * *